United States Patent [19]

Queen

[11] 4,287,391
[45] Sep. 1, 1981

[54] MICROPHONE ASSEMBLY FOR SPEECH RECORDING USING NOISE-ADAPTIVE OUTPUT LEVEL CONTROL

[75] Inventor: Daniel Queen, Chicago, Ill.

[73] Assignee: RHR Industries, Ltd., Cliffside Park, N.J.

[21] Appl. No.: 50,623

[22] Filed: Jun. 21, 1979

[51] Int. Cl.$^3$ ............................................. H04R 27/00
[52] U.S. Cl. .................................. 179/1 P; 179/1 VL
[58] Field of Search ................ 179/1 P, 1 D, 15.55 R, 179/1 VL; 333/17 R; 328/167; 455/307, 309; 330/294, 302, 303

[56] References Cited

U.S. PATENT DOCUMENTS

| | | | |
|---|---|---|---|
| 3,538,253 | 11/1970 | Braun | 179/1 P |
| 3,803,357 | 4/1974 | Sacks | 179/1 P |
| 4,025,721 | 5/1977 | Graupe et al. | 179/1 P |
| 4,207,543 | 6/1980 | Izakson et al. | 179/1 P |

Primary Examiner—Jerry Smith
Assistant Examiner—E. S. Kemeny
Attorney, Agent, or Firm—Posnack, Roberts, Cohen & Spiecens

[57] ABSTRACT

A microphone which uses noise-adaptive automatic output level control in speech recording. An input amplifier cooperates with a voltage doubler to form an automatic gain control. A diode and capacitor circuit provides for envelope detection of the signal which is then differentiated, amplified and detected to result in a DC control signal. This control signal is applied to an output amplifier which functions as a three pole Chebyshev filter in which a reduction of gain dampens one pole of the filter causing the response to drop off, so that the signal appearing at the output of the microphone has a substantially high speech-to-noise ratio. The output signal appears at a constant level where it may then be acted upon by the automatic gain control of an associated tape recorder connected to the microphone.

12 Claims, 1 Drawing Figure

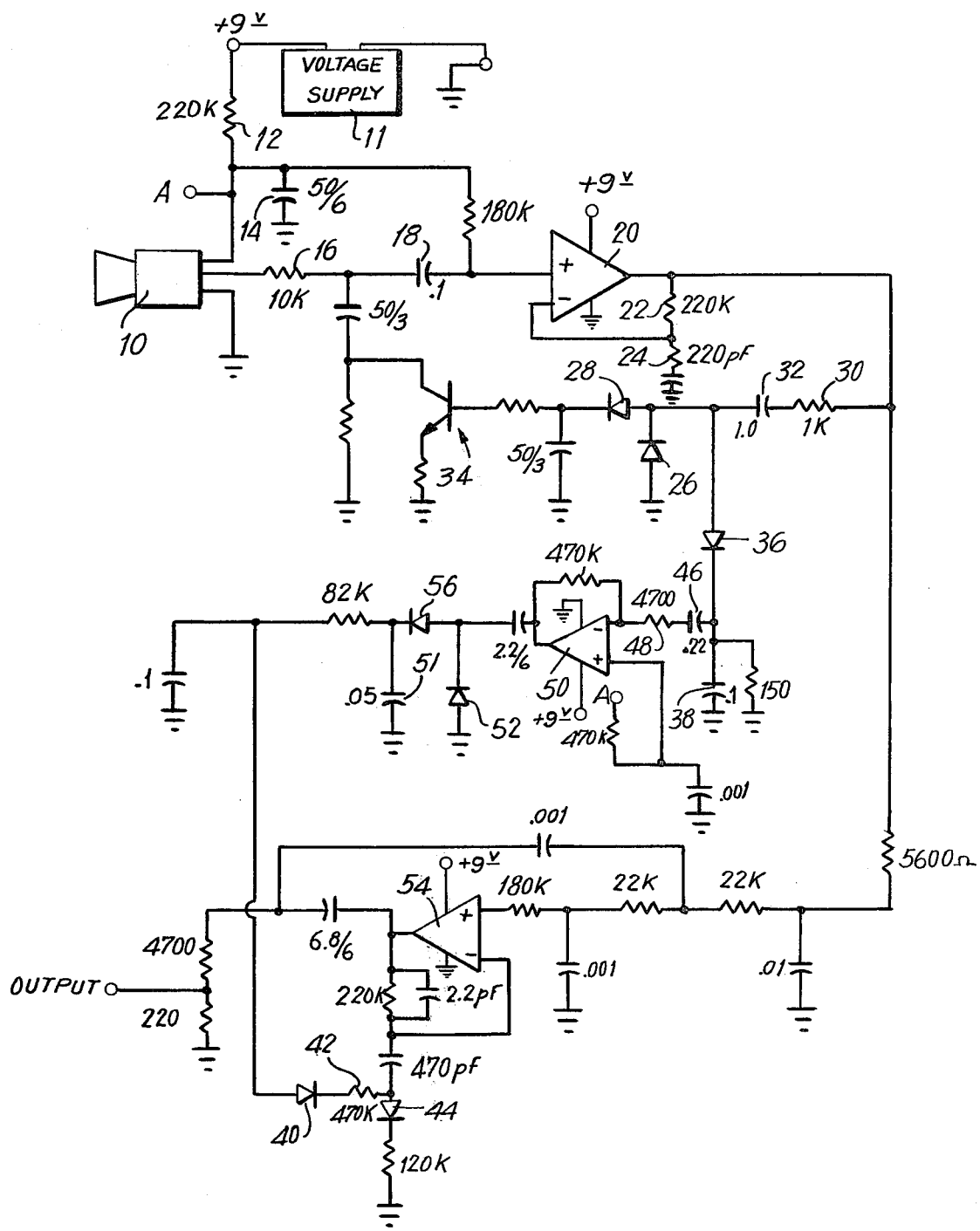

MICROPHONE ASSEMBLY FOR SPEECH RECORDING USING NOISE-ADAPTIVE OUTPUT LEVEL CONTROL

FIELD OF THE INVENTION

This invention relates to microphone assemblies inclusive of combinations of microphones and preamplifier circuits.

BACKGROUND OF THE INVENTION

In conventional audio tape recorders, particularly those intended for recording speech, automatic recording level control has been provided to assure adequate recording level even though the speech level may be low. Provision in such conventional audio tape recorders is also present to prevent overload if the speech level becomes too high.

The automatic conventional level controls, however, do not discriminate between the speech signals and undesirable sounds which may be gathered by the microphone. The conventional automatic level controls respond, instead, to the average total sound pressure applied to the microphone.

Thus, if the speech amplitude at a distance somewhat remote from the microphone is comparable to the noise amplitude as it impinges on the microphone, the automatic control will reduce the gain to a point where the recorded speech may be unintelligible.

SUMMARY OF INVENTION

In contrast to the prior art, the present invention provides means for disciminating between the noise and the speech, so that the automatic level control is sensitive mainly to the level of speech, while reducing at the same time the amount of noise, when that noise is at a level close to that of the speech signals.

The fundamental frequency and the first format of speech are of less importance to speech intelligibility than are the highest formats, and, for this reason, these lower frequencies are first filtered out at the input of the microphone assembly. Since the system depends on frequency and time domain differences between speech and noise, it is essential initially that the gathering of the sound by the microphone be highly uniform. As a result, the present invention uses a very small wide range microphone in the preferred embodiment. This microphone is typically an "electret" microphone measuring 3×5 millimeters in size on the entrance port surface and 1.2 millimeters thick. The output of this microphone is applied to an initial filtering circuit which provides a gentle low frequency rolloff which favors the second and higher format.

Since the frequency content of noise and speech are similar, differences between the noise and speech signals may be found in the time content. Thus, speech is composed of intermittent bursts averaging approximately 3 milliseconds duration, once the fundamental and first format are attenuated. Speech masking noise, on the other hand, is relatively stationary and continuous. To the extent that any input is not stationary, it will be interpreted herein as speech. However, since the microphone according to the present invention is intended for use in conferences, classrooms, and the like, it is probable that non-stationary noises will be highly intermittent in character, and thus will not create severe interferences.

A high level of stationary noise functions to reduce further the bandwidth of the system, particularly at high frequencies. While this increases attenuation of some consonant sounds, the result is that it has a greater effect in reducing the total noise energy, thereby increasing the speech-to-noise ratio. The total signal modified, in this manner, is applied to an automatic gain control network.

Accordingly, it is an object of the present invention to provide an automatic gain control (AGC) which searches the bandwidth limited signal of a signal having the characteristics of speech and adjusts the gain of the microphone assembly according to the amount of speech present, independently of the presence of stationary noise.

Another object of the present invention is to provide a microphone assembly of the foregoing character which is substantially simple in construction and may be economically fabricated.

A further object of the present invention is to provide an arrangement in conjunction with a microphone, as described, which may be readily maintained in service, and which has a substantially long operating life.

The objects of the present invention are achieved by providing a microphone assembly for speech recording using noise-adaptive automatic output level control which is different from non-adaptive "compander" type systems used in tape recording and synchronous systems used in space communications. The latter are not "adaptive" in that they require modification of transmitting means and complementary modification of receiving means to reduce noise in the communicating medium. The present invention uses only a receiver and adapts to noise present in the medium.

The arrangement of the present invention, furthermore, distinguishes from adaptive systems used for music reproduction, which are not intended to provide automatic level control. Such systems use some type of adaptive bandwidth reducer on low passages of music, while restoring the bandwidth on high passages. Some systems, which are intended to remove phonograph record clicks, discriminate against short rectangular pulses, allowing musical transients, which feature a reverberant decay.

The present invention distinguishes further from adaptive "expanders" which require a measurable margin of speech level over noise level in order to increase that margin during non-speech intervals. The present invention assumes that intelligible speech may be contained in a signal with measurable steady state noise at a level equal to or greater than the speech, when each is measured broadband.

In accordance with the present invention, there is provided a non-inverting operational amplifier which may be set for fixed gain. Connected between the input of the microphone and the amplifier is a circuit for eliminating the fundamental frequency and first format. The output of the amplifier is applied to a voltage doubler which applies a signal to a transistor. With an increase in positive signal on this transistor base, the resistance of the transistor decreases thereby reducing the signal. The combination of the amplifier, voltage doubler and transistor functions as an ordinary automatic gain control. The input to the voltage doubler is shunted through a diode which is connected to a capacitor so as to provide envelope detection of the signal appearing at the output of the amplifier. The test signal is then differentiated, amplified, and detected to provide a DC control signal which can be applied to a diode that causes the gain of an auxiliary amplifier to be varied. This auxiliary amplifier is part of a three pole Chebyshev filter, and a reduction of the gain of this auxiliary amplifier is such as to damp one pole of the filter causing the response to drop off.

Stated otherwise, the microphone assembly of the invention is designed to circumvent a problem usually encountered with recorders equipped with automatic gain controls, when used for the continuous untended recordings of meetings and conferences or the like. While AGC is useful in such circumstances it can cause a form of desensitizing of the recording channel in the presence of high continuous noise levels such as may occur due to the ventilation system in the meeting room or noisy public areas outside the meeting room. Under such conditions, the noise causes a maximum gain level to be set which is generally not sufficient to pick up more distant speech signals adequately to overcome tape noise.

The present invention provides a preamplifier or assembly which analyzes the incoming signal to determine its degree of randomness. When the signal is highly random (as it would be with a relatively continuous noise) the record channel bandwith is reduced more than its gain. When speech appears in the signal, even though the signal-to-noise ratio is low, the bandwidth begins to open up and the gain increases allowing intelligible speech to be recorded. The degree of gain change and bandwidth variation is thus a function of the temporal properties of the signal rather than its spectral properties.

The assembly of the invention utilizes an omnidirectional microphone with uniform directivity well beyond the audio range, thus eliminating problems due to directivity when recording a meeting where the sound source can be at any position around the microphone—or where unequal pick up of reflections can cause articulation problems.

The invention is also useful in broadcasting—particularly in difficult interview situations that take place at public and private meetings at airports, etc. In these situations the microphones usually used have difficulty discriminating speech from surrounding babble which densitizes the AGC controlled recorders which are currently utilized.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

In the drawing:

The sole FIGURE is a schematic diagram of the electrical circuit components and their interconnections constituting a microphone assembly, in accordance with the present invention.

DESCRIPTION OF THE PREFERRED EMBODIMENTS

Referring to the drawing, an electret microphone 10 is energized from a DC voltage supply 11 through a resistor 12. The applied DC voltage is decoupled by a capacitor 14.

The signal resulting from sound impinging on the microphone 10 is applied through a resistor 16 and capacitor 18, to the non-inverting input of an operational amplifier 20. The capacitor 18 provides low frequency rolloff to eliminate the fundamental frequency and first format. The amplifer 20 is a fixed gain amplifier, and its gain may be set by resistors 22 and 24.

The output of the amplifier 20 is applied to a voltage doubler 26 and 28 through resistor 30 and capacitor 32. The voltage doubler, in turn, applies a signal to transistor 34. With an increase in positive signal on the base of transistor 34, the resistance of this transistor decreases, thereby reducing the signal. Thus, the combination of amplifier 20, the voltage doubler 26, 28 and transistor 34 functions as an ordinary automatic gain control.

The input to the voltage doubler, however, is shunted through a diode 36 which cooperates with capacitor 38 to provide envelope detection of the signal appearing at the output of amplifier 20.

The test signal is then differentiated, amplified, and detected to provide a DC control signal which can be applied through a diode 40 and resistor 42, to diode 44. The differentiation is carried out by capacitor 46 and the components loading it, including the input resistance 48 of amplifier 50. This amplifier 50 provides the amplification, and the detection is achieved by diode 56, and capacitor 51.

Diode 44 causes the gain of output amplifier 54 to be varied. Amplifier 54 is part of a three-pole Chebyshev filter, and therefore a reduction of the gain of amplifier 54 is such as to damp one pole of the filter causing the response to drop off.

As a result of the arrangement, in accordance with the present invention, the signal appearing at the output when there is a high noise-to-speech ratio, will be bandwidth limited to reduce the effect of the noise while emphasizing the speech signal. Speech alone will pass through wide range. This speech signal appears at a constant level at the output, where it may then be acted upon by the automatic gain control of the associated tape recorder. However, since the effect of the noise has been reduced, the noise will not disable the associated tape recorder in the manner that it would if an ordinary microphone preamplifier were to be used.

In a preferred embodiment of the present invention, which is intended for use with recorders that do not contain their own automatic gain controls, the output of the voltage doubler comprised of diodes 26 and 28, containing the noise dependent signal, is inverted and applied to the base of transistor 34, so as to reduce the effect of the control voltage feedback on the automatic gain control stage 20, thereby allowing it to act upon itself.

Without further analysis, the foregoing will so fully reveal the gist of the present invention that others can readily adapt it for various applications without omitting features that, from the standpoint of prior art, fairly constitute essential characteristics of the generic or specific aspects of this invention, and therefore, such adaptations should and are intended to be comprehended within the meaning and range of equivalence of the following claims.

What is claimed is:

1. A microphone assembly for recording speech characterized by a speech burst rate, with a noise-adaptive automatic output level control for an associated tape recorder having automatic gain control means, said microphone assembly comprising: transducing means for transducing an electrical audio signal with minimal distortion of directional characteristics; input amplifier means connected to said transducing means and including an output; means coupled to said transducing means and to said input amplifier means for attenuating the fundamental and first formant of said signal; automatic gain control means connected to the output of said input amplifier means; output amplifier means connected to the output of said input amplifier means and to said automatic gain control amplifier means and including controllable high-frequency bandwidth limitation means; and speech-noise differentiating means connected to said automatic gain control amplifier means and detecting presence of said speech burst rate with the fundamental and first formant attenuated to derive a control voltage representing percentage of speech, said control voltage being applied as control inputs to both the automatic gain control amplifier means and the bandwidth limitation means resulting in the generation of a constant level for processing by the automatic gain control means of said associated tape recorder.

2. A microphone assembly as claimed in claim 1 comprising an additional AGC means including an input, the transducing means being connected to the input of said additional AGC means; said additional AGC means being controlled by said output amplifier means whereby to provide a gain-controlled output.

3. A microphone assembly as claimed in claim 2 wherein the said output amplifier means has an output connected to the input of said additional AGC means.

4. A microphone assembly as claimed in claim 1 in which the transducing means is physically separated from all the said amplifier means.

5. A microphone assembly as claimed in claim 1 wherein said attenuating means includes a capacitor for attenuating the fundamental and first formant of the audio signal, and capacitor being operatively associated with and coupled between said transducing means and input amplifier means.

6. A microphone assembly as claimed in claim 1 wherein said input amplifier means comprises a non-inverting operational amplifier.

7. A microphone assembly as claimed in claim 1 including means for setting the gain of said input amplifier means, said input amplifier means being a fixed-gain amplifier.

8. A microphone assembly as claimed in claim 1 comprising a voltage doubler means coupled to said input amplifier means and transistor means characterized by a resistance and connected to said voltage doubler means whereby when a positive signal is applied to said transistor means, the resistance of said transistor means decreases, said transistor means being coupled in feedback relation with said input amplifier.

9. A microphone assembly as claimed in claim 8 wherein said voltage doubler means comprises diode means.

10. A microphone assembly as claimed in claim 1 comprising envelope detection means coupled to said input amplifier means and comprising diode means and capacitor means in operative combination, said envelope detection means providing for envelope detection of the signal generated by said input amplifier means.

11. A microphone assembly as claimed in claim 1 wherein said output amplifier means comprises a three-pole Chebyshev filter.

12. A microphone assembly as claimed in claim 1 including means for varying the gain of said output amplifier means.

* * * * *